United States Patent
You et al.

(10) Patent No.: US 10,958,248 B1
(45) Date of Patent: Mar. 23, 2021

(54) JITTER ATTENUATION BUFFER STRUCTURE

(71) Applicant: International Business Machines Corporation, Armonk, NY (US)

(72) Inventors: Yang You, Austin, TX (US); Glen A. Wiedemeier, Austin, TX (US); Chad Andrew Marquart, Austin, TX (US); Jeffrey Kwabena Okyere, Austin, TX (US); Daniel M. Dreps, Georgetown, TX (US); Sudipto Chakraborty, Plano, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/884,613

(22) Filed: May 27, 2020

(51) Int. Cl.
*H03H 11/04* (2006.01)
*H03F 3/45* (2006.01)

(52) U.S. Cl.
CPC ..... *H03H 11/0422* (2013.01); *H03F 3/45183* (2013.01); *H03F 3/45273* (2013.01); *H03H 2011/0477* (2013.01)

(58) Field of Classification Search
CPC ............ H03F 3/45273; H03F 3/45183; H03H 11/0422; H03H 2011/0477
USPC .................................................. 327/108–112
See application file for complete search history.

(56) References Cited

U.S. PATENT DOCUMENTS

| 9,270,602 B1 | 2/2016 | Mimms et al. |
| 9,325,319 B1 * | 4/2016 | Mishra ................. H03K 19/094 |
| 9,608,611 B1 | 3/2017 | Hearne et al. |
| 2019/0041896 A1 | 2/2019 | Wong et al. |

FOREIGN PATENT DOCUMENTS

| CN | 101435862 B1 | 5/2009 |
| CN | 103346778 B2 | 12/2015 |
| KR | 101043668 B1 | 6/2011 |

OTHER PUBLICATIONS

Raczkowski, K., Markulic, N., Hershberg, B., & Craninckx, J. (2015). A 9.2-12.7 GHz Wideband Fractional-N Subsampling PLL in 28 nm CMOS with 280 fs RMS Jitter. IEEE Journal of Solid-State Circuits, 50(5), 1203-1213.
Disclosed anonymously (Nov. 2019). High-Gain Low-Jitter CML to CMOS Converter. IPCOM000260358D.
Song, J., Hwang, S., Lee, H. W., & Kim, C. (2017). A 1-V 10-Gb/s/pin Single-Ended Transceiver With Controllable Active-Inductor-Based Driver and Adaptively Calibrated Cascaded-Equalizer for Post-LPDDR4 Interfaces. IEEE Transactions on Circuits and Systems I: Regular Papers, 65(1), 331-342.

* cited by examiner

*Primary Examiner* — John W Poos
(74) *Attorney, Agent, or Firm* — Robert R. Williams

(57) ABSTRACT

A method and apparatus are described to implement a bandpass filter in a current mode logic (CML) stage of a clock tree in an electronic system. The bandpass filter has a bandpass filter transfer function to attenuate frequencies lower than and higher than a carrier frequency. The bandpass filter uses adjustable active inductors and capacitive source degeneration. Adjustable resistors may be controlled to move a peak frequency of the bandpass filter transfer function to a higher or lower frequency. The adjustable active inductors and capacitive degeneration may consist of field effect transistors.

10 Claims, 10 Drawing Sheets

JITTER ATTENUATION BUFFER STRUCTURE

BACKGROUND

A high-speed clocking system in an electronic system includes a clock signal chain having a plurality of stages in order to drive relatively large capacitive loads. However, jitter can build up in the plurality of stages, causing timing uncertainty and phase inaccuracy of the output clock signal.

SUMMARY

Embodiments of the invention provide a high-speed current mode logic (CML) integrated circuit which is a key building block component and is used to buffer periodic clock signals in various applications including wireline and wireless communications. Embodiments of the invention enable a jitter-attenuating bandpass filter transfer function that is very much desirable in any application having a carrier which demands a low jitter clock signal, especially those that operate at high clock frequency such as 8 GHz and higher. Specifically, a CML stage that can shape a jitter power spectral density (PSD) by suppressing signal components both at lower frequency, i.e. lower sideband (LSB), and higher frequency, i.e. higher sideband (USB), than the carrier is shown.

In an embodiment, the bandpass filter is shown that avoids using passive inductors, but instead uses field-effect transistor (FET) based adjustable active inductors.

The CML stage is capable of being tuned such that different clock frequencies can be supported by controlling the FET based adjustable resistors.

DETAILED DESCRIPTION

Embodiments presented provide input jitter attenuation function for a high-speed current mode logic (CML) stage used in a clock signal chain arrangement to buffer periodic clock signals in various applications including wireline and wireless communications.

Embodiments of the CML stage use a combination of an adjustable active inductor peaking and capacitive source degeneration to provide a bandpass filter transfer function to the input signal. The adjustable active inductor requires less area on a semiconductor chip than does a passive inductor having "loops" on the chip.

Embodiments of the CML stage use a source degeneration circuit to suppress lower sideband (LSB) jitter components without presenting a large capacitive load on the preceding stage. The invention comprises an adjustable active inductor comprising a Field-Effect Transistor (FET)-only solution so that key components (inductor, capacitor, and resistor) can be implemented using FETs. In addition, the circuitry can incorporate tunable FET-based resistors to align a bandpass filter peaking frequency to a desired frequency.

Figure 1:
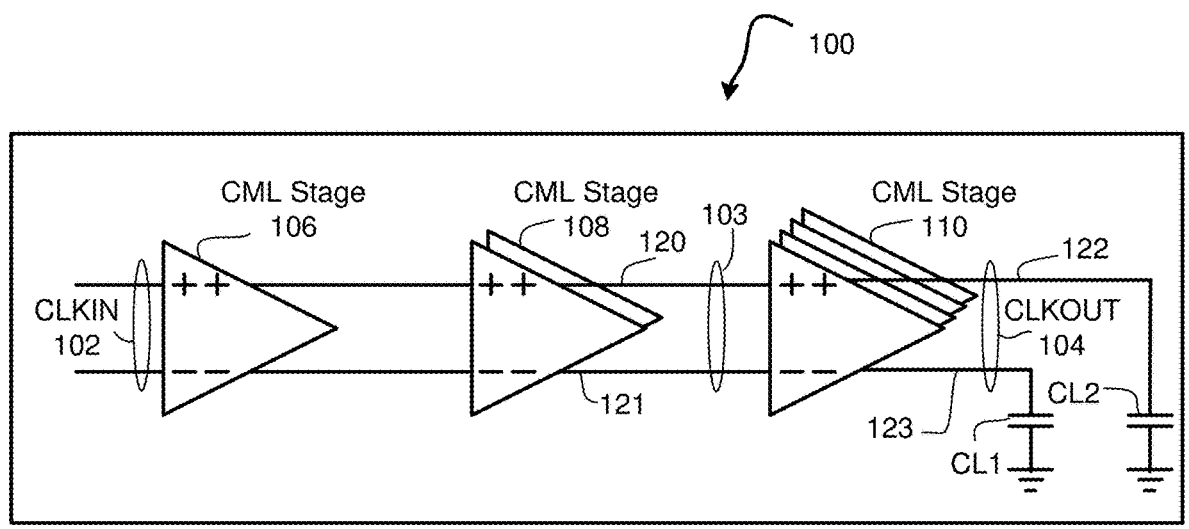
FIG. 1 is a block diagram of a clock signal chain for a differential clock signal, the clock signal chain having three CML stages.

FIG. 1 shows an example of a CML clock signal chain comprising embodiments of the invention. The CML clock signal chain is used in an electronic system 100. In the example CML clock buffer, CML stage 106 receives differential signal CLKIN 102. A differential output of CML stage 106 is further repowered by CML stage 108. CML stage 108 drives a repowered differential signal 103, with plus and minus phases referenced as 120 and 121 to a final CML stage, CML stage 110. This multistage buffering system provides a powerful enough differential signal on CLKOUT 104, with plus and minus phases referenced as lines 122 and 123, to drive a capacitive load on each of signals 122 (CL2) and 123 (CL1) with enough swing at the output CLKOUT 104 to satisfy a clock requirement of the designer. A designer is careful to make CL1 and CL2 as close to the same as possible. Three CML buffer stages are shown for exemplary purposes, but fewer or more stages are contemplated. A single CML buffer stage such as CML stage 110 is contemplated. Size of the three CML stages may be scaled from CML stage 106 through CML stage 110 in a way so that CML stage 110 has enough power to drive a given capacitive load on both lines 122 and 123, while the input CLKIN 102 only sees a reasonably small loading from the input of CML stage 106. As a nonlimiting example, each succeeding CML stage may have two times the power of an immediately preceding stage. A CML stage capable of driving a large capacitive load (e.g., CL1 and CL2 output lines 123 and 122 in FIG. 1) requires a small load resistor and thus a large tail current to provide a specified swing at a specified frequency. It is understood that the CML signal chain in FIG. 1 is just an example.

It is understood that the clock signal chain can consist of any CML-based circuit, such as when electronic system 100 uses a CML-based divider, a CML-based phase rotator, or a CML-based MUX (multiplexer).

When the clock signal, starting with CLKIN 102, passes through a chain of buffer CML stages, each CML stage contributes a certain amount of jitter at the output. The jitter includes power supply induced jitter and device noise induced random jitter. These jitter components are broadband and harmful to high speed communication where the jitter causes a clock edge position to be unpredictable resulting in, for example, degradation of a signal eye opening in wireline communication or contamination of the neighboring channels in wireless communication. In the practice of designing an advanced communication system an electronic system 100, a chain of CML stages may be required. Each stage is to provide specific functionality, for example, frequency division, frequency multiplication, phase adjustment, or buffering. The more stages in the clock signal chain, the more jitter will be built up at the output. Therefore, achieving adequate jitter performance becomes challenging.

In the following discussion, CML stage 110 will be used to explain how any CML stage may provide a bandpass filter. While implementing a bandpass filter in only the final CML stage of a clock powering chain such as CML stage 110 in FIG. 1, significantly reduces jitter on CLKOUT 104, a designer may choose to also implement a bandpass filter in one or more earlier CML stages in the clock powering chain.

Bandpass filtering is well known as an effective way to attenuate jitter. A stage that has a bandpass filter may be placed as the last stage to attenuate jitter that is built up along the clock signal chain.

The bandpass filter transfer function of a bandpass filter may not be symmetric around the peaking frequency, but as long as the LSB and USB jitter components are attenuated relative to the carrier, the jitter can be attenuated to some degree. For example, if only the USB is completely removed but the LSB remains intact, the jitter on CLKOUT 104 will still be attenuated.

Figure 2:
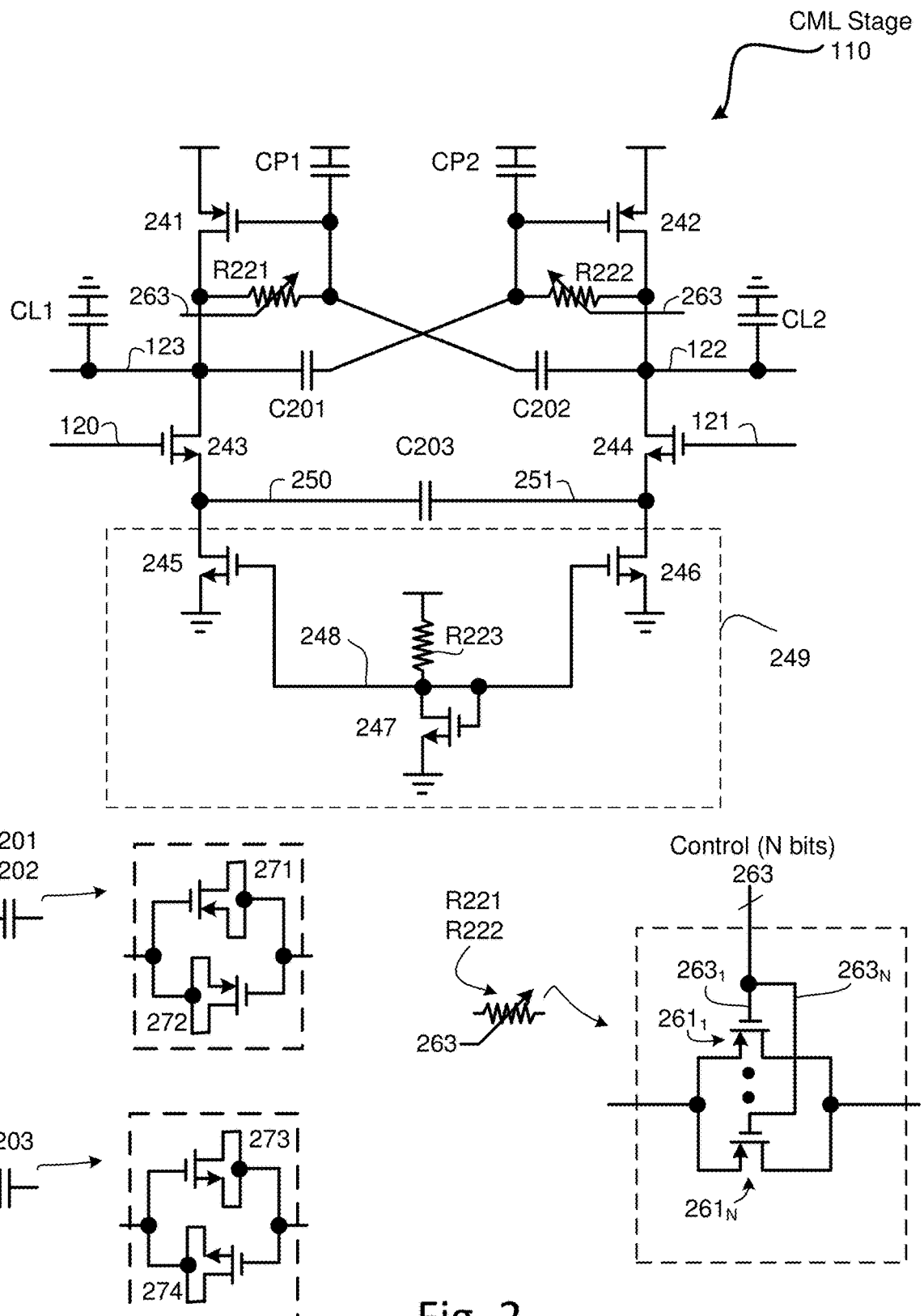
FIG. 2 is a schematic of a CML stage with filtering function to attenuate both LSB and USB components around a carrier, the input differential clock signal.

With reference to FIG. 2, a schematic of CML stage 110 is shown. Differential inputs 120 and 121 of differential signal 103 are coupled to gates of N-channel field effect transistors (NFETs) 243 and 244. Drains of NFETs 243 and 244 are coupled to CLKOUT 104, which is a differential signal comprising signals 122 and 123, the differential output signals of CML stage 110.

With continuing reference to FIG. 2, an adjustable active inductor peaking arrangement is shown comprising P-Channel FETs (PFETs) 241 and 242 operating in saturation region; and cross-coupled capacitors C201 and C202. Capacitances CP1 and CP2 represent parasitic capacitance at gates of PFETs 241 and 242. A designer is careful to make both sides of a CML stage have parasitic capacitances CP1 and CP2 as close as possible to be the same value. The adjustable active inductor is used to make the solution compact and affordable for various applications. The bandpass filter peaking frequency may be controlled by adjusting resistors R221 and R222 with control 263.

The source degeneration capacitor C203, coupled as shown between sources of NFETs 243 and 244, is used to suppress LSB jitter components without presenting additional loading of the preceding stage.

This embodiment of the invention provides a compact FET-only solution because the inductors, capacitors, and resistors can all be implemented using FETs. In addition, the solution may incorporate tunable R221 and R222 to align bandpass filter transfer function peak amplitude frequency to the carrier frequency.

FIG. 2 also shows an implementation of a variable resistor suitable for resistors R221 and R222. In the implementation of R221 and R222, shown in the variable resistor detailed inset, comprise a number of parallel PFETs $261_1$ to $261_N$ are shown, each in linear region when turned on by a digital control bit from control 263, the control bits denoted as $263_1$ to $263_N$ to control resistance of R221 and R222 to a specified resistance value to determine a peak amplitude frequency of the bandpass filter transfer function. Capacitors C201, C202, and C203 may be implemented with one or more back-to-back connected FETs (NFET or PFET) having source and drain connected together as a first contact and gate as a second contact, thus comprising FETs for all components of the CML stage 110. C201 and C202 implementation is shown having PFETs 271 and 272. C203 implementation is shown as comprising NFETs 273 and 274.

Tail current generator 249 comprises NFETs 245 and 246, each providing a tail current to nodes 250 and 251, respectively. Each tail current is set by current mirror voltage 248 supplied by an exemplary biasing branch comprising R223 and NFET 247. Drains of NFETs 245 and 256 have high small signal output impedance, providing good low frequency attenuation in the bandpass filter.

Figure 3:
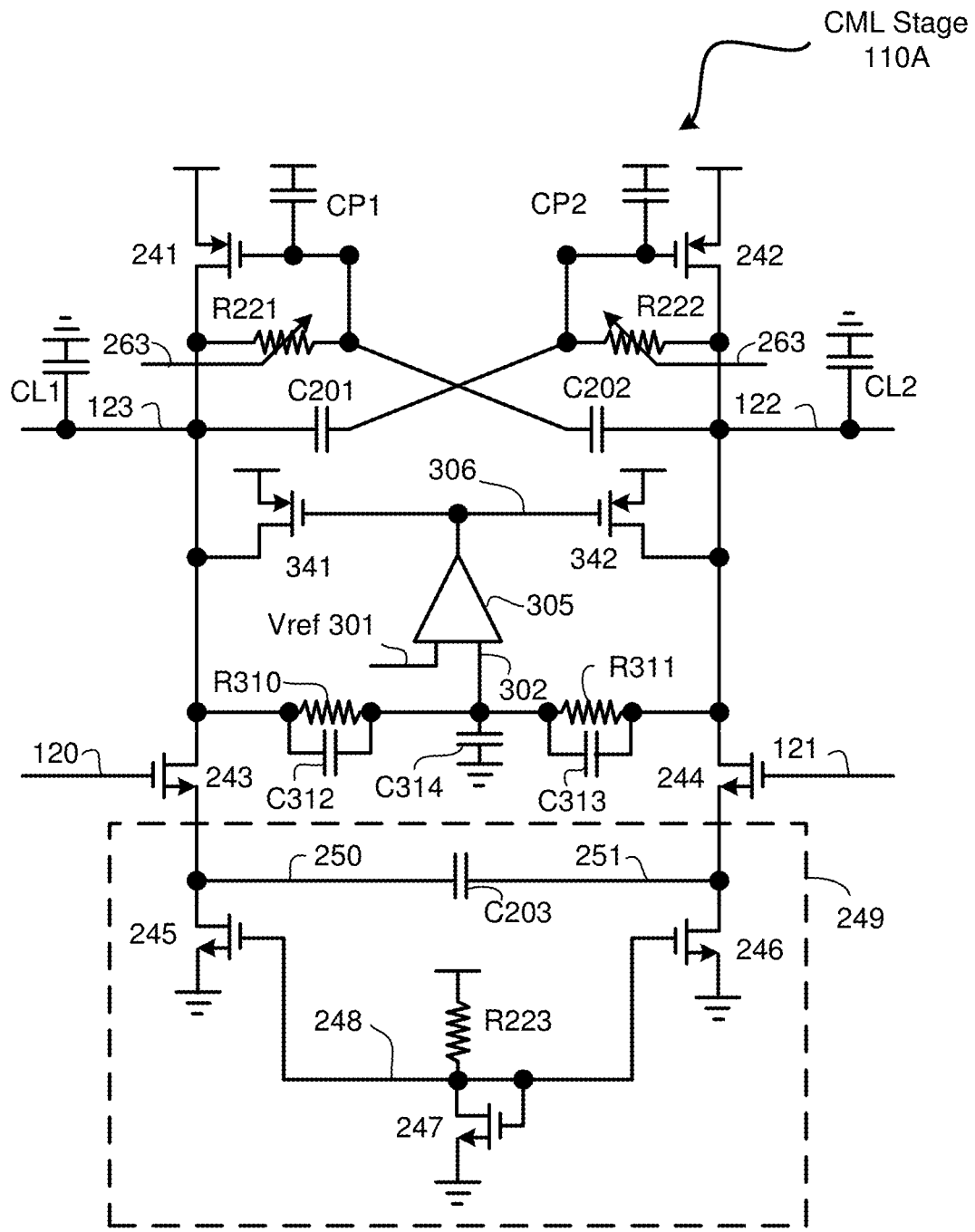
FIG. 3 is a schematic of a CML stage similar to that of FIG. 2, but which includes additional circuitry to also control a common mode of a differential output of the CML stage.

FIG. 3 has the same circuit configuration as the circuit in FIG. 2 and referenced with the same references as the circuit of FIG. 2 but includes some additional circuitry to provide control of a common mode voltage on CLKOUT 104 (differential output lines 122 and 123). The CML stage in FIG. 3 is referenced as CML stage 110A to indicate that it contains additional circuitry over CML stage 100. Resistors R310 and R311 are equal and coupled between differential output lines 122 and 123 and thus node 302 is the common mode voltage of CLKOUT 104. Resistors R310 and R311 are of high enough resistance so that output amplitude on CLKOUT 104 is not significantly affected. Capacitors C312 and C313 are used to help stabilize the loop; capacitor C314 filters noise at node 302. C312, C313, and C314 can also be FET based capacitors. Operational amplifier 305 compares node 302 and a reference voltage 301 and outputs signal 306 which is connected to gates of PFETs 341 and 342. The common mode of differential output lines 122 and 123 is driven to the reference voltage 301. Reference voltage 301 may be a user input or may be created by a resistor divider between a positive supply voltage (Vdd) and ground.

Figure 4A:
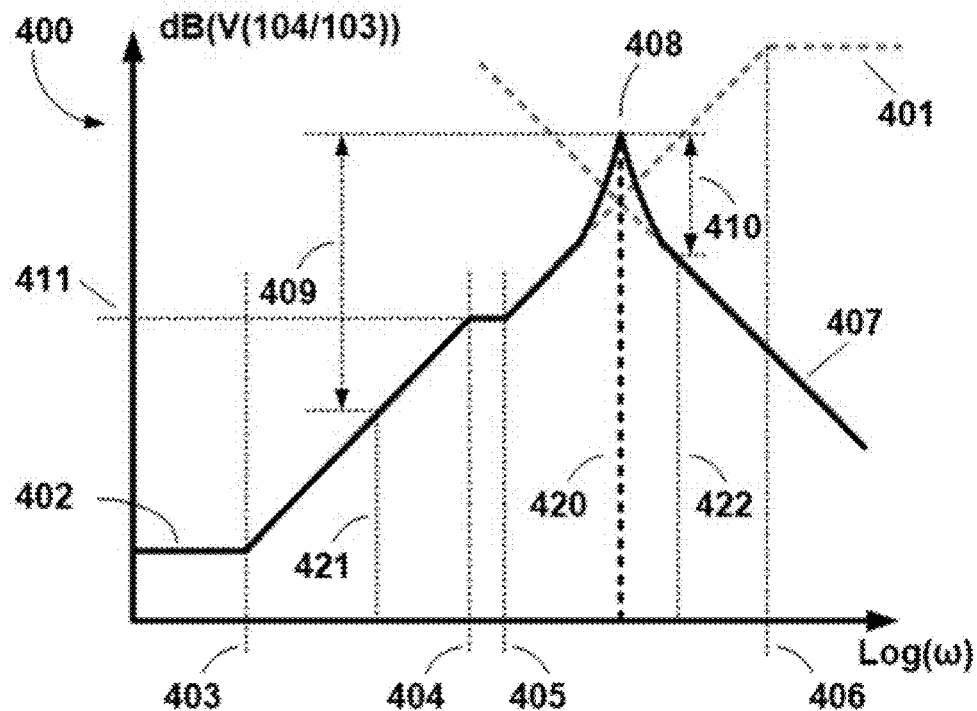
FIG. 4A shows a Bode plot of the bandpass filter implemented in the CML stage, and the magnitude attenuation achieved at LSB and USB components around the carrier frequency.

With reference now to FIG. 4A, a Bode plot 400 of the bandpass filter implemented by CML stage 110 is related with equations by references below to components in the circuit of FIG. 2. The X axis is $\log(\omega)$, where $\omega$ is $(2*\pi*f)$, where f is frequency. The Y axis is dB (V(104/103)). For simplicity, reference numbers are used in equations; for example, "104" refers to CLKOUT 104. FIG. 4A references slopes and points of interest to circuit elements in FIG. 2. "gm" means transconductance of an FET. For example gm243 means "transconductance of NFET 243 which tells how much change in drain current you get when a small change in voltage occurs at the gate".

Carrier 420 is at a frequency shown on the X axis and has a peak amplitude gain 408.

CML stage 100 is seen to be symmetric, that is, each component on one side has a corresponding component on the other side. Therefore, it is understood that the equations apply to both halves of CML stage 110 because of the symmetry of the design. For example, in "Reference 401" below, a similar reference in the right (in FIG. 2) half of CML stage 110 out would be dB (gm244*R222).

Reference 401 dB(gm243*R221)
Reference 402: dB(1/(R231*gm241))

Reference 403: log(1/(2*R231*C203))
Reference 404: log(gm243/(2*C203))
Reference 405: log(1/(R221*(C202+CP1)))
Reference 405A (FIG. 5): shows reference 405 when R221 and R222 are adjusted for a lower frequency peak 408A.
Reference 405B (FIG. 5): shows reference 405 when R221 and R222 are adjusted for a higher frequency peak 408B.
Reference 406: log(gm241/(C202+CP1))
Reference 407: dB(gm243/($\omega$*CL1))
Reference 408: The peak of the bandpass filter transfer function having a magnitude shown by heavy dotted line 420 at the carrier frequency.
Reference 409: Shows attenuation at frequency of 421 versus carrier peak 408.
Reference 410: Shows attenuation at frequency of 422 versus carrier peak 408. Frequencies of 422 and 421 have the same offset (on a linear scale) from the carrier (420) frequency.
Reference 411: dB(gm243/gm241)
Reference 420 shows the amplitude gain of signals 104/103 (in dB) at the carrier frequency.
Reference 421 shows an LSB at a frequency of the LSB.
Reference 422 shows a USB at a frequency of the LSB.
USB 421 and LSB 422 are at frequencies where the LSB and USB components of a sinusoid jitter locate. USB 421 and LSB 422 have the same frequency offset from the frequency of carrier 420. The bandpass filtering profile shows a signal attenuation of 409 at the frequency of USB 421, and a signal attenuation 410 at the frequency of USB 422.

Figure 4B:
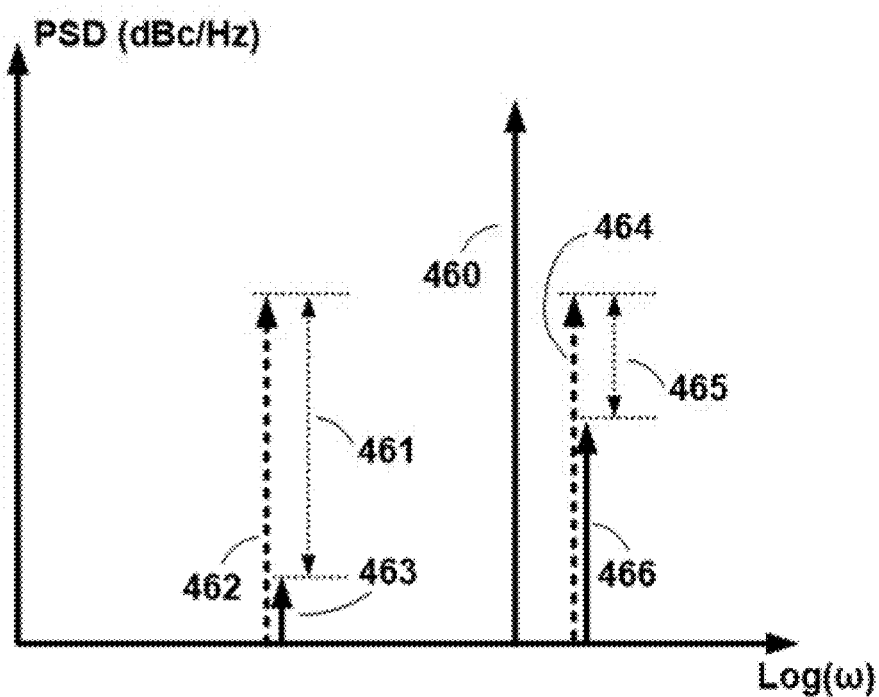
FIG. 4B shows a power spectrum density (PSD) plot of a carrier with phase modulation at a single frequency and attenuation of its LSB and USB due to the bandpass filter function in FIG. 4A.

FIG. 4B shows a PSD of a carrier with phase modulation at a single frequency and attenuation of jitter PSDs of LSB and USB due to the bandpass filter function in FIG. 4A. This exemplary signal has one carrier 460 PSD, one LSB PSD and one USB PSD components. The carrier is located at frequency of carrier 420. The pre-filtered LSB (462) and USB (464) components are assumed to have identical power and represent the jitter PSD before filtering. The jitter PSD of LSB component is located at the same frequency as USB 421. The jitter PSD of USB component is located at the same frequency as 422. Reference 463 shows PSD of the LSB 462 as attenuated by the bandpass filter. Reference 461 shows attenuation of jitter PSD 462 by the bandpass filter. Reference 466 shows an attenuated jitter PSD of the USB 464 as attenuated by the bandpass filter. Reference 465 shows attenuation of jitter PSD 464. In other words, the dotted lines in FIG. 4B are the original jitter PSD components amplitude and the solid lines represent the attenuated jitter PSD components.

Figure 5:
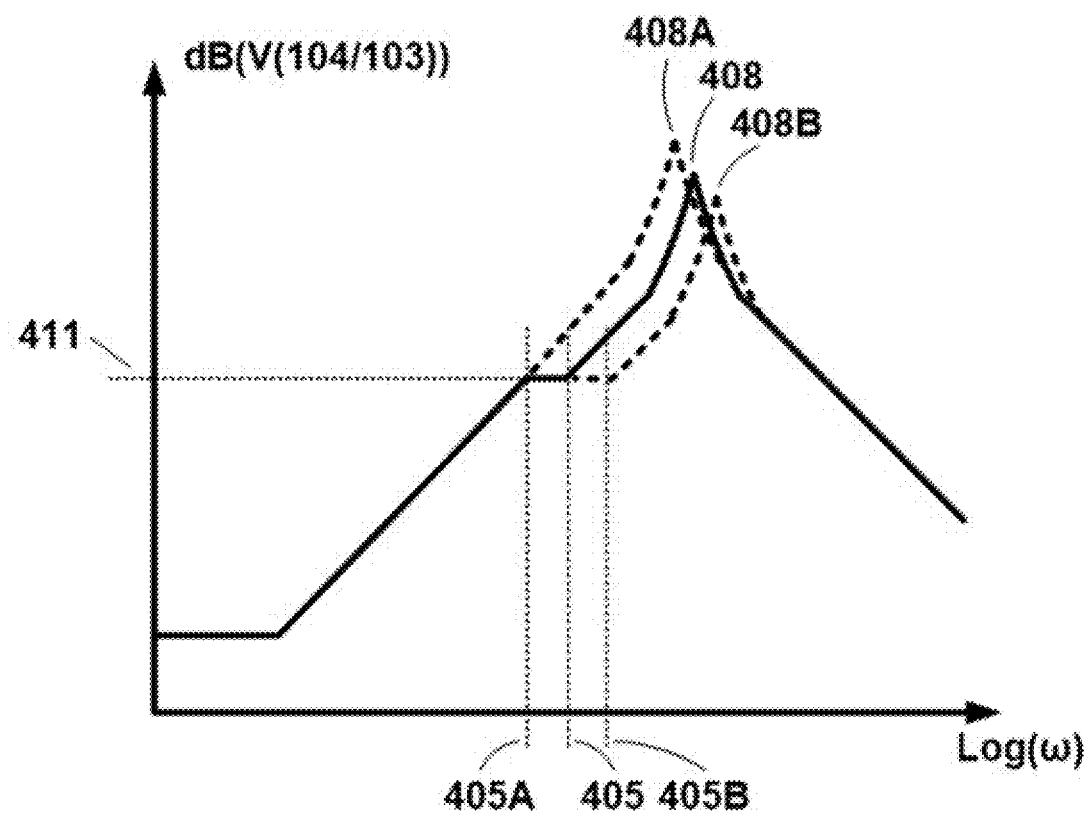
FIG. 5 shows a Bode plot of the bandpass filter and shows the effect of making FET based adjustable resistors in adjustable active inductors smaller and larger to move the peaking frequency of the bandpass filter to a higher or lower frequency.

Note that, in FIG. 5, from reference 405, a zero from the adjustable active inductors can be shifted to the right by adjusting control 263 to adjust R221 and R222 to a lower resistance (moving reference 405 to the right as depicted by reference 405B and peak 408B) with a slight reduction in amplitude gain from differential signal 103 to differential signal 104. Similarly, the adjustable active inductor zero can be shifted to the left by adjusting control 263 to R221 and R222 to be higher resistance (moving reference 405 to the left to 405A and peak 408A) with a slight increase in amplitude gain from differential signal 103 to differential signal 104. In other words, the dotted lines are the original jitter components amplitude and the solid lines represent the attenuated jitter components.

Ability to move the peak 408 to a lower or higher frequency by controlling resistance value of R221 and R222 is important in an electronic system intended for use at different frequencies.

The circuitry described for exemplary purposes is configured with NFETs for a number of FETs and with PFETs for other FETs.

There are two types of FETs: an NFET and a PFET.

Those of skill in the art will recognize that the circuitry described could also be implemented "upside down", with all NFETs changed to PFETs and all PFETs changed to NFETs. Positive voltage supply Vdd would become ground and ground would become a positive voltage supply. When "FET of a first type" and "FET of a second type" are used, it will be understood that if the FET of a first type is an NFET then the FET of the second type is a PFET. Alternatively, if the FET of a first type is a PFET then the FET of the second type is an NFET.

FIGS. 6 to 9 show simulation results that demonstrate effectiveness of circuit CML stage 110.

Figure 6:
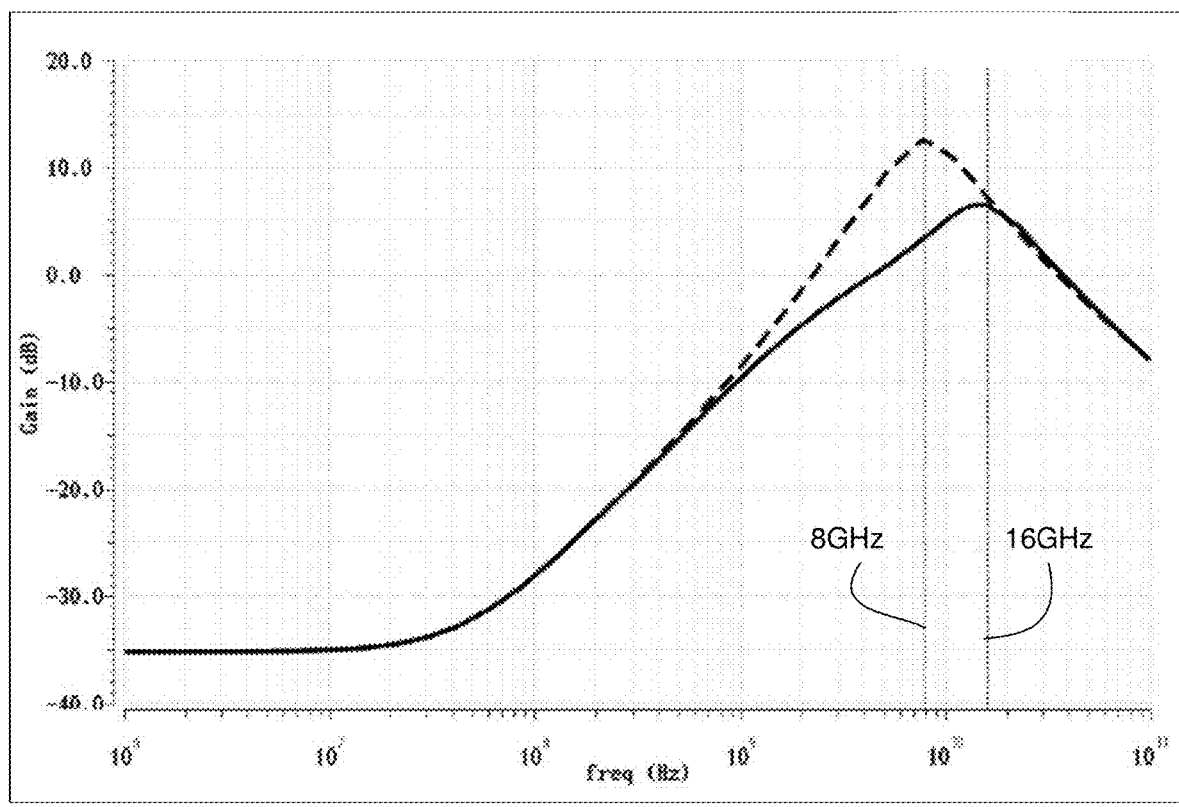
FIG. 6 shows a simulation of a Bode plot of the bandpass filter implemented by the CML stage, showing a peaking frequency being moved from 8 GHz to 16 GHz.

FIG. 6 is a simulation plot of the bandpass filter transfer function of CML stage 110 where the peak amplitude frequency can be tuned, using control 263, with the adjustable resistors R221 and R222 as described earlier. As shown at two different resistance values of R221 and R222 the peak amplitude frequency can be set at either 16 GHz or 8 GHz. As seen in the simulation, control 263 can control the peak amplitude frequency of the bandpass filter transfer function by at least by a factor of two. While not simulated in FIG. 6, as shown in FIG. 5, changing resistor R221 and 222 in the other direction would move the peak amplitude frequency to a lower frequency and a higher amplitude.

Figure 7:
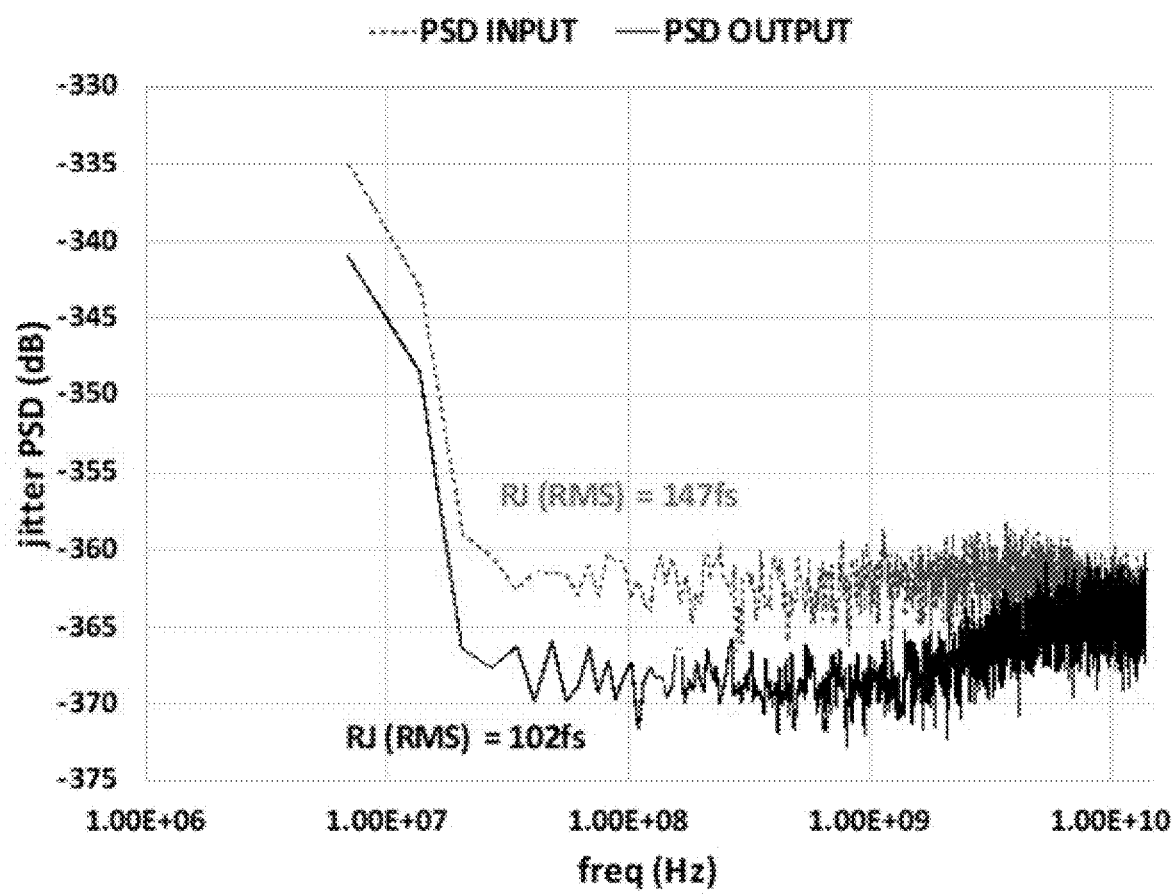
FIG. 7 shows a simulation of reshaping of the jitter PSD versus frequency, showing PSD of an input to CML stage and the resultant PSD output of the CML stage.

FIG. 7 shows a simulated input to CML stage 110 (differential signal 103 comprising signals 120 and 121) and CML stage 110 output CLKOUT 104 (signals 122 and 123) jitter PSD profiles. In this simulation, only the jitter from device noise source is included. However, CML stage 110 will attenuate any other type of input jitter at inputs 120 and 121. The jitter PSD is measured at the zero-crossings of the waveform with units of time. If one takes an integration of the PSD and does a root mean square (RMS) calculation, it will equal the RMS of the random jitter (RJ) which is indicated in the plot. The dashed curve is the jitter PSD of the input differential input 103 where the jitter is broadband. After passing through the bandpass filter of CML stage 110, the input jitter PSD is reshaped by the bandpass filter transfer function from the low to high frequency and the jitter PSD is reduced as shown on the solid line representing jitter PSD on CLKOUT 104. The reduction of the jitter PSD demonstrates jitter PSD reduction (random jitter) which is provided by CML stage 110.

Figure 8:
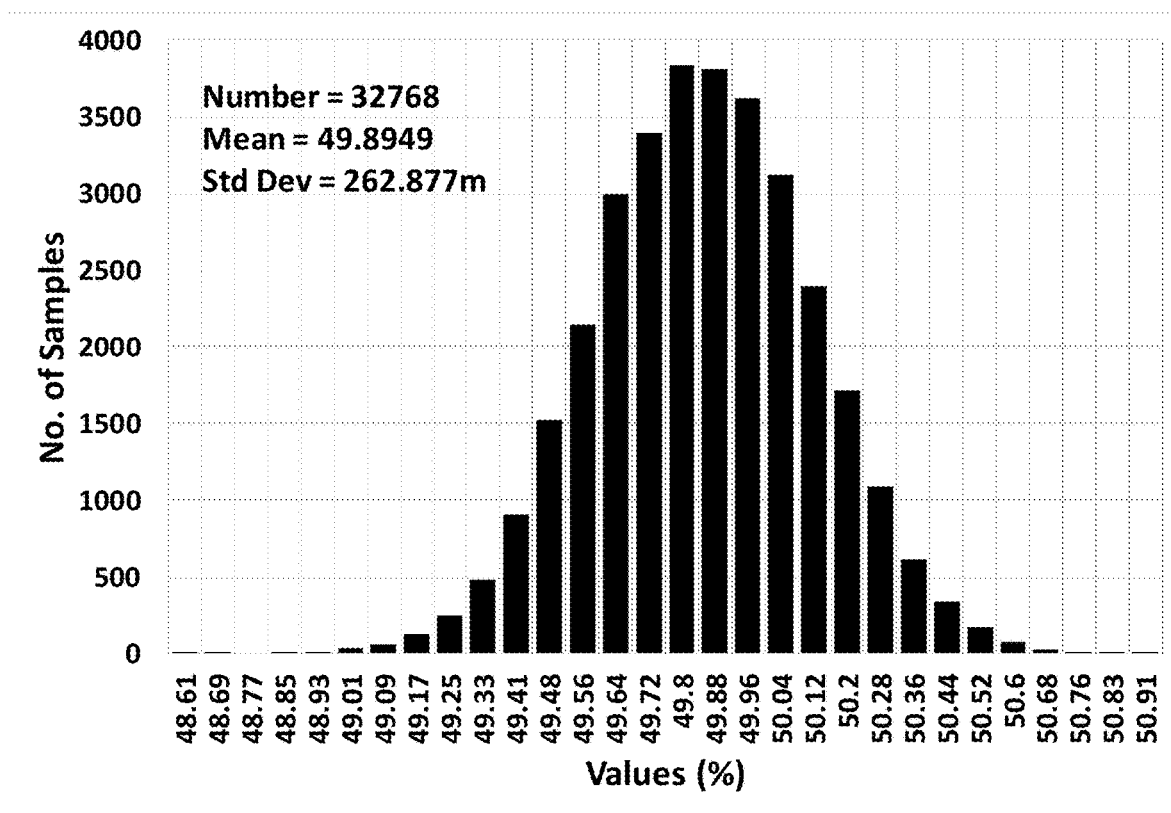
FIG. 8 shows a histogram of a simulated duty cycle of an input to the CML stage. Duty cycle is a ratio of clock "1" within one clock cycle over the clock cycle, typically 50%. The histogram shows the mean and standard deviation of the duty cycle at the input of the CML stage.
Figure 9:
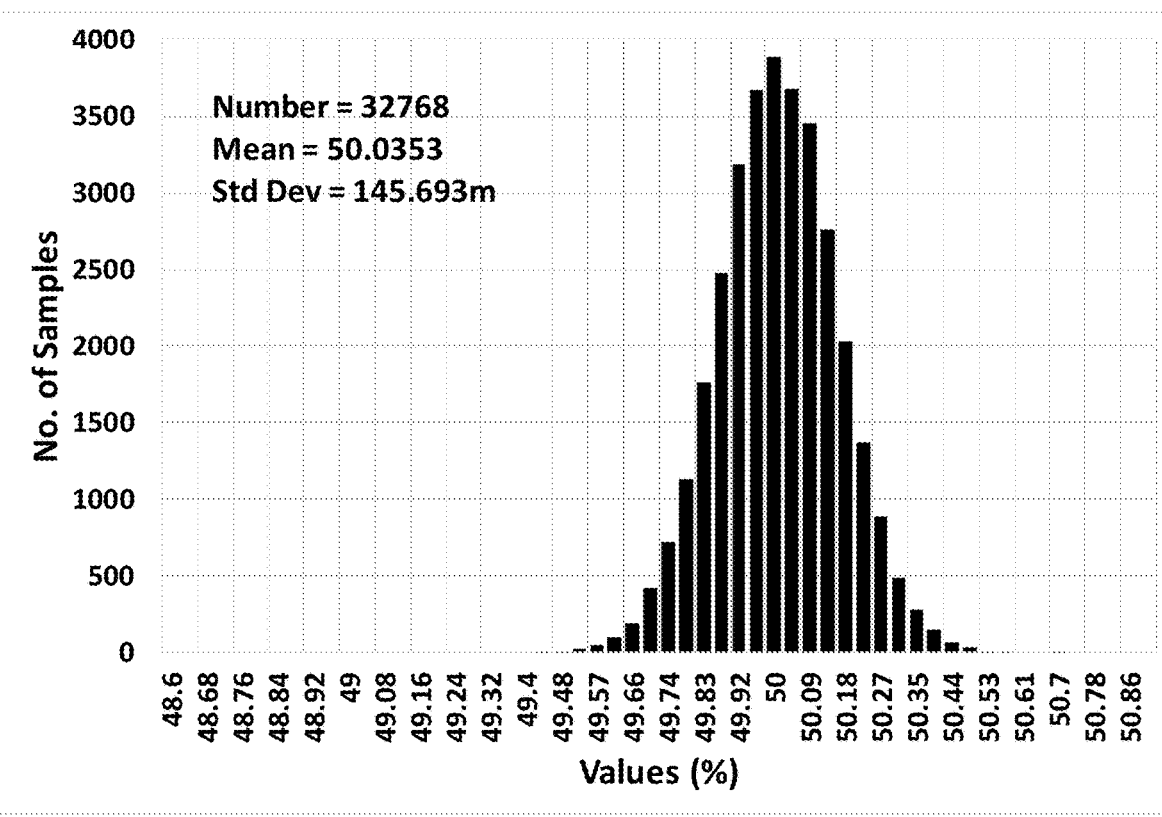
FIG. 9 shows a histogram of the simulated duty cycle at the output of the CML stage. The histogram shows the mean and standard deviation of the duty cycle at the output of the CML stage.

As a special form of jitter, duty cycle variation can also be improved by the proposed solution. FIGS. 8 and 9 show histograms of input and output percent duty cycle, where duty cycle is defined as percentage of time the clock is "1" during a clock cycle.

FIG. 8 shows a duty cycle histogram of the input signal, differential signal 103, to CML stage 110. The standard deviation is shown to be 0.262877%. The "Std Dev" in FIG. 8 reads "262.877m", where "m" means "10**-3".

FIG. 9 shows a duty cycle histogram of the output 104 of CML stage 110. A standard deviation of the input 103 duty cycle is 0.262877% (FIG. 8). A standard deviation of the output 104 duty cycle is 0.145693%.

Figure 10:
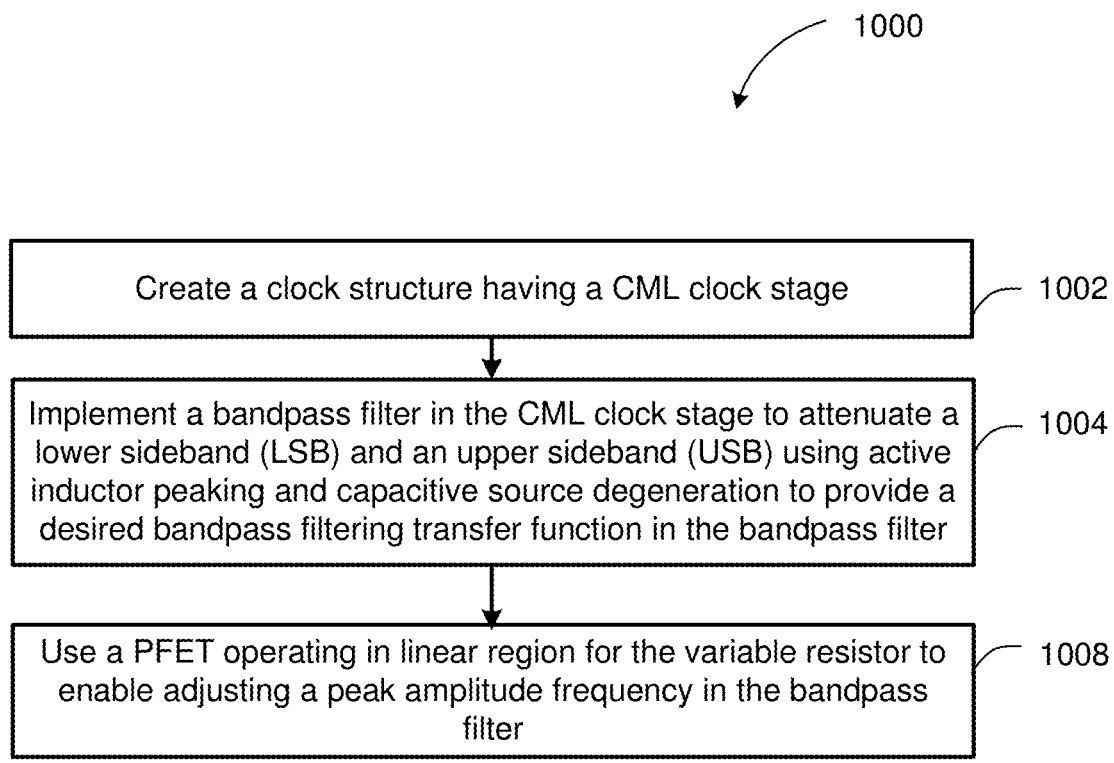
FIG. 10 is a method embodiment of the invention.

With reference now to FIG. 10, a method 1000 is shown as a flow chart.

Block 1002 comprises creating a clock structure comprising a CML stage to drive a differential clock. It is understood that block 1002 may further comprise a plurality of CML stages, each having more drive than the previous CML stage, the last CML stage having enough drive to drive a designated load.

Block 1004 comprises implementing a bandpass filter in the CML stage. The bandpass filter has a bandpass filter transfer function to peak at the carrier frequency and attenuate lower and higher frequencies such as lower sideband (LSB) and upper sideband (USB) components. The bandpass filter transfer function provides progressively greater attenuation of frequency components as those frequency components are further apart from the carrier frequency. The bandpass filter comprises adjustable active inductor peaking and capacitive source degeneration to provide the bandpass filter transfer function.

Block 1008 comprises using a FET-based tunable resistor to adjust a frequency at which the bandpass filter transfer function peak amplitude occurs.

What is claimed is:

1. A jitter attenuation clock signal chain comprising:
   a current mode logic (CML) stage comprising a bandpass filter, the bandpass filter having a bandpass filter transfer function to attenuate jitter, the CML stage further comprising:
   a differential pair of FETs comprising a first FET of a first type having a gate coupled to a minus phase of a differential input and a second FET of the first type having a gate coupled to a plus phase of the differential input, the first FET of the first type and the second FET of the first type each having a source coupled to a tail current generator, the tail current generator presenting a separate high impedance current source to each of the sources of the first FET of the first type and the source of the second FET of the first type;
   the first FET of the first type having a drain coupled to a plus phase of a differential output and the second FET of the first type having a drain coupled to a minus phase of the differential output;
   a capacitive source degeneration capacitor coupled between the sources of the first and second FETs of the first type;
   a first adjustable active inductor coupled to the plus phase of the differential output;
   a second adjustable active inductor coupled to the minus phase of the differential output;
   the first adjustable active inductor circuit further comprises:
   a first FET of a second type biased in a saturated region, a drain of the first FET of the second type coupled to the plus phase of the differential output to a supply voltage and a source coupled to a supply voltage;
   a first variable resistor coupled between the plus phase of the differential output and a gate of the first FET of the second type;
   a first capacitor having a first contact coupled to the gate of the first FET of the second type and the minus phase of the differential output;
   the second adjustable active inductor circuit further comprises:
   a second FET of the second type biased in a saturated region, a drain of the second FET of the second type coupled to the minus phase of the differential output;
   a second variable resistor coupled between the minus phase of the differential output and a gate of the second FET of the second type; and
   a second capacitor coupled between a gate of the second FET of the second type and the plus phase of the differential output.

2. The jitter attenuation clock signal chain of claim 1, further comprising:
   the first and second variable resistors are controlled by a control voltage to adjust a peak amplitude frequency of the bandpass filter transfer function.

3. The jitter attenuation clock signal chain of claim 2, the peak amplitude frequency of the bandpass filter transfer function is increased by decreasing values of the first and second variable resistors.

4. The jitter attenuation clock signal chain of claim 2, the peak amplitude frequency of the bandpass filter transfer function is decreased by increasing values of the first and second variable resistors.

5. The jitter attenuation clock signal chain of claim 1, further comprising an output common mode voltage control.

6. The jitter attenuation clock signal chain of claim 5, the output common mode voltage control comprises:
   a common mode voltage of the differential output coupled to a first input of an operational amplifier and a common mode reference voltage coupled to a second input of the operational amplifier;
   a third FET of the second type having a gate coupled to the output of the operational amplifier, a drain coupled to the plus phase of the differential output and a source coupled to the supply voltage; and
   a fourth FET of the second type having a gate coupled to the output of the operational amplifier, a drain coupled to the minus phase of the differential output, and a source coupled to the supply voltage.

7. An electronic system comprising:
   a clock signal chain having a CML stage, the CML stage further comprising:
   a bandpass filter further comprising:
   a differential pair of FETs of a first type comprising a first FET of the first type and a second FET of the first type to receive a differential input, the first FET of the first type and the second FET of the first type each having a source coupled to separate high impedance current sources in a tail resistor generator, the first FET of the first type having a drain coupled to a plus phase of a differential output and the second FET of the first type having a drain coupled to a minus phase of the differential output;
   a capacitive source degeneration capacitor coupled between the sources of the first and second FETs of the first type;
   a first adjustable active inductor coupled to the plus phase of the differential output;
   a second adjustable active inductor coupled to the minus phase of the differential output
   the CML stage further comprising:
   the first adjustable active inductor circuit further comprises:
   a first FET of a second type biased in a saturated region, a drain of the first FET of the second type coupled to the plus phase of the differential output and a source coupled to a supply voltage;
   a first variable resistor coupled between the plus phase of the differential output and a gate of the first FET of the second type;
   a first capacitor coupled between the gate of the first FET of the second type and the minus phase of the differential output;

the second adjustable active inductor circuit further comprises:

a second FET of the second type biased in a saturated region, a drain of the second FET of the second type coupled to the minus phase of the differential output;

a second variable resistor coupled between the minus phase of the differential output and a gate of the second FET of the second type; and a second capacitor coupled between the gate of the second FET of the second type and the plus phase of the differential output; and the first and second variable resistors are controlled by a control voltage to adjust a peak frequency in a bandpass filter transfer function of the bandpass filter.

8. The electronic system of claim 7, the control voltage configured to adjust the peak frequency in the bandpass filter by up to a factor of two.

9. A method comprising:

creating a clock signal chain comprising a current mode logic (CML) stage, the CML stage being symmetric;

implementing a bandpass filter in the CML stage having a bandpass filter transfer function to attenuate frequencies lower than and higher than a carrier frequency, using adjustable active inductor peaking and capacitive source degeneration;

implementing a FET of a first type operating in linear region for a variable resistor to enable a control voltage to adjust a peak amplitude frequency of the bandpass filter transfer function; and implementing the adjustable active inductor to comprise a FET of the first type operating in a saturated region, the variable resistor, and a capacitor, the capacitor coupled to a gate of the FET of the first type operating in the saturated region and to an output on an opposite symmetrical side of the CML stage.

10. The method of claim 9, further comprising:

providing circuitry to adjust a common mode voltage on a differential output of the CML stage.

* * * * *